(12) United States Patent
Ausserlechner

(10) Patent No.: US 10,545,179 B2
(45) Date of Patent: Jan. 28, 2020

(54) CURRENT SENSOR CHIP WITH MAGNETIC FIELD SENSOR

(71) Applicant: Infineon Technologies AG, Neubiberg (DE)

(72) Inventor: Udo Ausserlechner, Villach (AT)

(73) Assignee: Infineon Technologies AG (DE)

( * ) Notice: Subject to any disclaimer, the term of this patent is extended or adjusted under 35 U.S.C. 154(b) by 264 days.

(21) Appl. No.: 15/175,722

(22) Filed: Jun. 7, 2016

(65) Prior Publication Data

US 2016/0356820 A1  Dec. 8, 2016

(30) Foreign Application Priority Data

Jun. 8, 2015 (DE) .................. 10 2015 109 009

(51) Int. Cl.
*G01R 15/20* (2006.01)

(52) U.S. Cl.
CPC ......... *G01R 15/202* (2013.01); *G01R 15/205* (2013.01)

(58) Field of Classification Search
CPC .. G01R 15/202; G01R 15/205; G01R 15/207; G01R 15/185; G01R 15/148; G01R 15/183; G01R 33/07; G01R 33/072; G01R 33/0035; G01R 33/0005; G01R 33/0017; G01R 33/02; G01R 33/0206; G01R 33/075; G01R 33/09; G01R 33/091; G01R 35/005; G01R 35/00; G01R 31/2829; G01R 31/007; G01R 31/2644; G01R 31/2856; G01R 31/2884; G01R 31/3004; G01R 31/3008; G01R 31/3012; G01R 31/315; G01R 31/3187; G01R 31/3606;
(Continued)

(56) References Cited

U.S. PATENT DOCUMENTS 7,414,409 B1* 8/2008 Faifer .................. G01R 31/311
324/522
8,362,764 B2* 1/2013 Peukert .................. G01R 33/07
324/207.2
(Continued)

FOREIGN PATENT DOCUMENTS

CN 101023367 A 8/2007
CN 103140770 A 6/2013
(Continued)

*Primary Examiner* — Lee E Rodak
(74) *Attorney, Agent, or Firm* — Design IP

(57) ABSTRACT

A current sensor chip and systems and methods for calibrating thereof are provided. The current sensor chip includes a first magnetic field sensor element configured to generate a first analog sensor signal representing a magnetic field caused by a primary current passing through an external primary conductor, an analog-to-digital converter coupled to the first magnetic field sensor element and configured to generate a digital sensor signal based on the first analog sensor signal, a digital signal processor coupled to the analog-to-digital converter to receive the digital sensor signal and configured to determine, based on the digital sensor signal and based on calibration parameters stored in memory, a corresponding current measurement signal that represents the primary current, and an external output pin coupled to the first magnetic field sensor element to receive the first analog sensor signal or an analog signal derived therefrom by analog signal processing.

19 Claims, 4 Drawing Sheets

(58) Field of Classification Search
CPC ...... G01R 31/361; G01R 19/00; G01R 19/20; G01R 27/2611; G01D 5/24452
See application file for complete search history.

(56) References Cited

U.S. PATENT DOCUMENTS

| | | | |
|---|---|---|---|
| 9,310,398 B2* | 4/2016 | Ausserlechner | G01R 15/207 |
| 9,612,262 B1* | 4/2017 | Nehmeh | G01R 15/202 |
| 2007/0247141 A1 | 10/2007 | Pastre et al. | |
| 2011/0234215 A1* | 9/2011 | Ausserlechner | G01R 15/20 324/244 |
| 2012/0001617 A1* | 1/2012 | Reynolds | G01R 15/18 324/74 |
| 2013/0015843 A1* | 1/2013 | Doogue | G01R 15/148 324/202 |
| 2013/0093412 A1 | 4/2013 | Anelli et al. | |
| 2014/0177674 A1* | 6/2014 | Drouin | G01D 3/0365 374/178 |
| 2014/0250969 A1* | 9/2014 | Alagarsamy | B81B 7/02 73/1.01 |
| 2015/0002169 A1* | 1/2015 | Lu | G01R 35/005 324/601 |
| 2015/0115937 A1 | 4/2015 | Fujita et al. | |
| 2015/0276892 A1* | 10/2015 | Butenhoff | G01R 33/072 324/251 |
| 2016/0252589 A1* | 9/2016 | Raman | G01R 33/0029 324/224 |

FOREIGN PATENT DOCUMENTS

| | | |
|---|---|---|
| CN | 104303065 A | 1/2015 |
| EP | 2871486 A1 | 5/2015 |
| WO | 2012003426 A2 | 1/2012 |
| WO | 2015030871 A1 | 3/2015 |

* cited by examiner

CURRENT SENSOR CHIP WITH MAGNETIC FIELD SENSOR

FIELD

Embodiments of the present invention relate to the field of current measurement using magnetic field sensors.

BACKGROUND

Contactless current measurement can be accomplished by using a magnetic field sensor to sense the magnetic field caused by a current passing through a primary conductor (further referred to as primary current). The magnetic field caused by the primary current depends on the magnitude of the primary current. For the example of a long straight wire carrying a primary current $i_P$ the magnitude of the resulting magnetic field H at a distance d from the wire is directly proportional to the primary current $i_P$. In accordance to the Biot-Savart law, the magnitude of the magnetic field H equals $H=i_P/(2\pi d)$ if the wire is very long (theoretically infinitely long) as compared to the distance d. In practice, a chip package, which includes the magnetic field sensor element (e.g. a Hall sensor) is placed closely to the primary conductor. This chip package is also referred to as sensor package or current sensor package. The magnetic field sensor element (or short: magnetic field sensor) included in the chip package is thus exposed to the magnetic field caused by the primary current, and the sensor signal (usually a voltage signal) provided by the magnetic field sensor element is proportional to the magnitude of the magnetic field and thus also proportional to the primary current.

Usually Hall sensors and magneto-resistive sensors are used for contactless current measurement. Magneto-resistive sensors are often referred to as XMR sensors, which is a collective term for anisotropic magneto-resistive (AMR), giant magneto-resistive (GMR), tunneling magneto-resistive (TMR), and colossal magneto-resistive (CMR) sensors. The sensor package may also include a signal processing circuit that receives the signal from the magnetic field sensor element (referred to as sensor signal) and derives, from the sensor signal, a measurement signal that represents the primary current.

A measuring device for contactless current measurement (also referred to as current sensor) usually includes a soft-magnetic core or a magnetic flux concentrator in order to direct the magnetic field, which is caused by the primary current, onto the magnetic field sensor element. The soft-magnetic core may also shield the magnetic field sensor element from disturbing external magnetic fields, which may cause measuring errors. However, using a soft-magnetic core of flux concentrators may give rise to undesired effects due to the non-linear characteristic and the hysteresis of the soft-magnetic core. The hysteresis of the core may lead to a zero-point error in the current measurement. To avoid such problems, coreless current sensors have been developed. However, when using coreless current sensors a precise positioning of the magnetic field sensor element relative to the primary conductor is crucial for an accurate current measurement. Thus, tolerances for the assembly of the current sensor have to be relatively tight.

Generally, the accuracy of coreless magnetic current measurement is affected by the geometry of the primary conductor (also referred to as current rail) and by the position of primary conductor relative to the magnetic field sensor element. To ensure a precise relative position of primary conductor and magnetic field sensor element, the primary conductor and the magnetic field sensor element can be integrated in the same chip package (sensor package). Such an approach is used, for example, in the TLI4970 current sensor family of Infineon. When using a current sensor with an integrated current rail, the primary conductor (e.g. a wire, a cable, a current bar, etc.) carrying the primary current has to be disconnected (interrupted) in order to insert the chip package with the integrated current rail. In many applications, disconnecting the primary conductor is either undesired or impossible. When using a primary conductor, which is fully external to the chip package including the magnetic field sensor element, the problem remains that the measured signal (representing the primary current) will heavily depend on the geometry of the assembly of primary conductor and chip package without precisely knowing the transfer characteristic (primary current to measured signal) of the measurement set-up. Thus there is a general need for improved current sensors which allow a precise coreless and contactless current measurement.

SUMMARY

A current sensor chip is described herein. According to one embodiment, the current sensor chip includes a first magnetic field sensor element, which is configured to generate a first analog sensor signal representing a magnetic field caused by a primary current passing through an external primary conductor. The current sensor chip further includes an analog-to-digital converter coupled to the first magnetic field sensor element and configured to generate a digital sensor signal based on the first analog sensor signal. A digital signal processor is coupled to the analog-to-digital converter to receive the digital sensor signal and configured to determine, based on the digital sensor signal and based on calibration parameters stored in a memory, a corresponding current measurement signal, which represents the primary current. An external output pin of the current sensor chip is coupled to the first magnetic field sensor element to receive the first analog sensor signal or an analog signal derived therefrom by analog signal processing.

According to another embodiment, the current sensor chip includes a first magnetic field sensor element, which is configured to generate a first analog sensor signal responsive to a magnetic field caused by a primary current passing through an external primary conductor. The current sensor chip further includes a second magnetic field sensor element, which is configured to generate a second analog sensor signal responsive to a magnetic field caused by the primary current passing through the external primary conductor. An analog-to digital converter is coupled to the second magnetic field sensor element and configured to generate a digital sensor signal based on the second analog sensor signal. A digital signal processor is coupled to the analog-to-digital converter to receive the digital sensor signal and configured to determine, based on the digital sensor signal and based on calibration parameters stored in a memory, a corresponding current measurement signal, which represents the primary current. An external output pin of the current sensor chip is coupled to the first magnetic field sensor element to receive the first analog sensor signal or an analog signal derived therefrom by analog signal processing.

Moreover, a system for calibrating a current sensor chip is described herein. According to one embodiment, the system comprises a current measurement set-up, which includes a current sensor chip and a primary conductor arranged adjacent to but separate from the current sensor chip. According to the present embodiment, the current sensor chip includes a first magnetic field sensor element, which is configured to generate a first analog sensor signal responsive to a magnetic field caused by a primary current passing through the primary conductor. The current sensor chip further includes a digital-analog-converter coupled to the first magnetic field sensor element or to a second magnetic field sensor element and is configured to generate a digital sensor signal based on the first analog sensor signal or, respectively, based on a second analog sensor signal. In the latter case, the second analog sensor signal is generated by the second magnetic field sensor element. Moreover, the current sensor chip includes a memory for storing calibration parameters and a digital signal processor configured to determine, using the calibration parameters stored in the memory and the digital sensor signal, a current measurement signal, which represents the primary current. An output pin of the current sensor chip is coupled to the first magnetic field sensor to receive the first analog sensor signal or an analog signal derived therefrom by analog signal processing and provide it as analog output signal. Furthermore, the system comprises a test signal generator, which is configured to provide a modulated test current, wherein the test signal generator is coupled to the primary conductor to inject the test current—as primary current—into the primary conductor. Moreover, the system comprises a demodulator, which is coupled to the output pin of the current sensor chip to receive the analog output signal, wherein the demodulator is configured to demodulate the analog output signal and to provide a measured value representing the magnitude of the analog output signal. A controller is coupled to the current sensor chip to transmit, to the memory of the current sensor chip, calibration parameters, which are based on the measured value representing the magnitude of the analog output signal.

Moreover, a method for calibrating a current sensor chip is described herein. According to one embodiment, the method includes: providing a current measurement set-up including a current sensor chip and a primary conductor arranged adjacent to but separate from the current sensor chip; generating a modulated test current having a specific magnitude and injecting the modulated test current—as primary current—into the primary conductor, thus causing a magnetic field; and tapping an analog output signal at an external pin of the current sensor chip, wherein the analog output signal is an analog sensor signal or derived therefrom by analog signal processing, and wherein the analog sensor signal is generated by a magnetic field sensor included in the current sensor chip. Moreover, the method includes demodulating the analog output signal to generate a measured value representing the magnitude of the analog output signal, wherein calibration parameters are determined, based on the measured value, and the calibration parameters are stored in a memory included in the current sensor chip.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
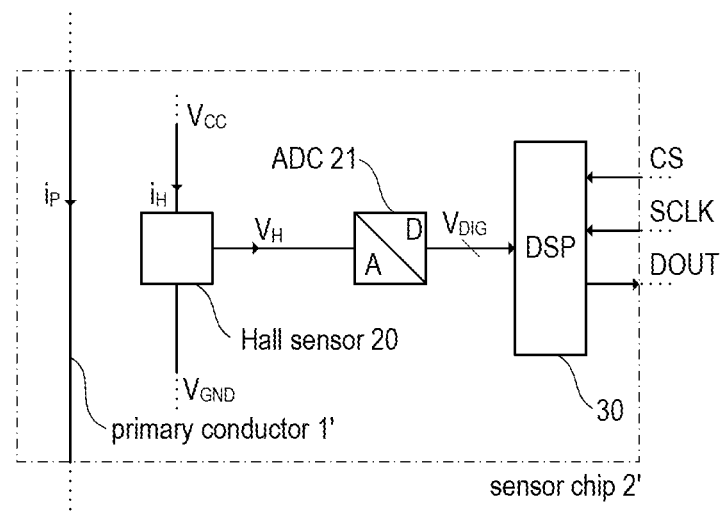
FIG. 1 is a block diagram illustrating an exemplary current sensor chip with integrated primary conductor and digital output.

The block diagram of FIG. 1 illustrates, as an illustrative example, a current sensor chip 2' with an integrated Hall sensor 20 as well as primary conductor 1' (integrated current rail). The primary conductor 1' is directed through the chip package of chip 2' and thus magnetically coupled to the Hall sensor 20. As both, the Hall sensor 20 and the primary conductor 1', are arranged in the same chip package, the position of the Hall sensor 20 relative to the primary conductor 1' is well defined. Therefore, the magnitude of the magnetic field H (in the sensitive direction of the Hall sensor 20) at the position of the Hall sensor 20 can be determined very accurately. Generally, the magnitude of the magnetic field H is proportional to the primary current $i_P$, that is $H=k \cdot i_P$, wherein the constant k is between zero and $(2\pi d)^{-1}$ which is the theoretic limit for an infinitely long straight primary conductor. Usually, a Hall sensor is formed by a plate-shaped conductor having defined length, width and thickness; the sensor is supplied with a constant sensor current. The analog output voltage $V_H$ of the Hall sensor 20 (Hall voltage) can be calculated as $V_H = A_H \cdot i_H \cdot \mu_0 \cdot H/t$, wherein $A_H$ is the Hall coefficient (in $m^3/C$), $\mu_0$ is the permeability constant, ix is the constant sensor current, and t is the thickness of the Hall plate. As can be seen from the above equation, the sensor voltage $V_H$ is proportional to the magnitude of the magnetic field and the magnetic field is proportional to the primary current, wherein the proportionality factors only depend on parameters (k, $A_H$, $i_H$, $\mu_0$, t) which are either constant or dependent on the design of the current sensor chip.

According to the example of FIG. 1 the sensor voltage $V_H$ is digitized using an analog-to-digital converter 21. The resulting digital sensor signal is denoted as $V_{DIG}$. Of course the sensor voltage $V_H$ may be amplified and filtered before being supplied to analog-to-digital converter 21. However, amplifiers and filters, the constant current source providing the sensor current $i_H$, power supply circuits, as well as other circuit components not necessary for the present discussion have been omitted in the Figures in order to keep the illustration simple. The digital sensor signal is provided to a digital signal processor 30 (e.g. included in a micro controller). The digital signal processor (DSP) 30 may be configured to calculate, based on the digital sensor signal $V_{DIG}$ and the above-mentioned proportionality factors, a digital measurement value representing the primary current. Additionally, the DSP may be configured to compensate for cross-sensitivities to other physical parameters, e.g., to temperature and chip-strain. Information concerning temperature and chip strain may be obtained using dedicated sensors (not shown in FIG. 1), whose output signals may also digitized and supplied to the DSP. In particular, the Hall coefficient $A_H$ is temperature dependent and thus the proportionality factor between magnetic field H and sensor voltage $V_H$ is also temperature dependent. However, as the temperature characteristic of the Hall coefficient $A_H$ is known, the cross-sensitivity to temperature can be compensated for, if the temperature is measured. In some embodiments, chip-stress (or strain) may be measured in order to allow compensation for a cross-sensitivity to chip-stress may also be compensated for. The measured temperature and stress signals may be digitized and provided to the DSP 30. The measured temperature and stress signals may be made available to an external device (e.g. by transmitting the measured values as digital information via a communication interface (see below). Alternatively, the measured temperature and stress signals may be made available to an external device via a dedicated chip pin (not shown).

To communicate with external electronic devices (e.g. an external controller unit, not shown in FIG. 1) the DSP 30 may include a communication interface circuit (or short: communication interface), which allows to transmit the measured current values digitally, e.g. via a data bus. In the present example, the DSP 30 communicates via a Serial Peripheral Interface (SPI) bus. The current sensor is a bus slave and receives a chip select (CS) signal, a clock (SCLK) signal from a bus master (e.g. the external controller unit) via dedicated chip pins and provides a serial data stream DOUT at an output pin of the sensor chip 2'. The DSP 30 may be any kind of digital circuitry suitable for processing digital signals. The DSP 30 may include a software-controlled Central Processing Unit (CPU) and additional hard-wired digital and analog circuitry. Alternatively, the DSP may be composed of hard-wired digital circuitry and optional analog circuitry. For example, the DSP may be implemented using a Field Programmable Gate Array (FPGA), a Programmable Logic Array (PLA), a Complex Programmable Logic Device (CPLD). Alternatively, the DSP may be included in an Application Specific Integrated Circuit (ASIC).

Figure 2:
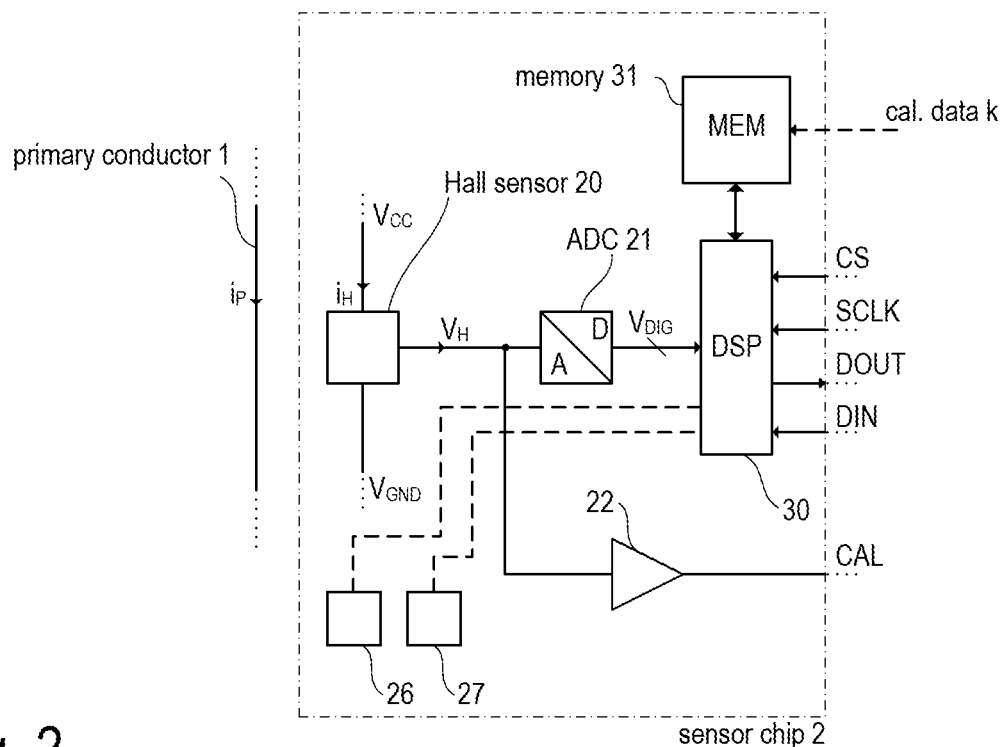
FIG. 2 is a block diagram illustrating one embodiment of a current sensor chip for use with an external primary conductor; the current sensor has a digital output as well as an analog output that provides the analog sensor signal of an integrated Hall sensor for calibration of the current sensor.

The block diagram of FIG. 2 illustrates one exemplary current sensor chip 2 with an integrated Hall sensor 20, which is magnetically coupled to an external (i.e. outside the chip package) primary conductor 1. In this context, "current sensor chip" denotes the packaged chip, which may include one or more semiconductor dies with integrated circuits. Using an external primary conductor allows contact-less current measurement without the need to disconnect the primary conductor 1 in order to insert the integrated current rail. Instead, the current sensor chip 2 is fixed to (e.g. clamped onto) the primary conductor 1. The Hall sensor 20 included in the sensor chip 2 may be identical or similar as in the previous example and thus reference is made to the description above. However, the proportionality factor k ($k=H/i_P$) between primary current $i_P$ and magnetic field H is not a-priori known as the position of the sensor chip 2 (and thus the position of the Hall sensor 20) relative to the primary conductor 1 is not known at the time the current sensor chip 2 is produced. Therefore, the proportionality factor k depends on the use of the sensor chip 2 and the geometry of the current measurement set-up, in which the sensor chip 2 is employed.

As in the previous example, the sensor voltage $V_H$ of the Hall sensor 20 is digitized (e.g. after amplification and filtering), and the resulting digital sensor signal $V_{DIG}$ is supplied to DSP 30. The digital signal processor (DSP) 30 may be configured to calculate, based on the digital sensor signal $V_{DIG}$ and the above-mentioned proportionality factors, a digital measurement value representing the primary current $i_P$ passing through the external primary conductor 1. For this purpose, a calibrated proportionality factor k ($k=H/i_P$) or K ($K=V_H/i_P$) may be obtained using calibration data stored in memory 31. In this context calibration data refers to any data which can be used to determine a calibrated value for the proportionality factor. For example, the calibrated proportionality factor may be stored in the memory 31. Alternatively, the calibration data may include correction data, which can be used to determine the calibrated value from a nominal value. The memory 31 may be connected to DSP 30, which is configured to communicate with an external controller unit (or any other external device) via a data bus or a point-to-point connection. The digital communication interface of DSP 30 has already been described with reference to FIG. 1. In the present example, the DSP 30 may additionally receive an input data stream DIN (e.g. in accordance with the SPI standard), which allows an external controller unit (or any other external device) to send calibration data (and any other data) to the DSP 30, which stores the calibration data in memory 31 or updates previously stored calibration data.

In order to enable calibration of the device a test current $i_{TEST}$ may be injected into the primary conductor 1 as primary current ($i_P=i_{TEST}$). The current sensor is usually configured to measure comparably large currents (e.g. 100 A or more). In order to keep the complexity of the set-up used for calibration low, it is desired to use a comparable low test current $i_{TEST}$ (e.g. 1 A or less). However, such a small test current $i_{TEST}$ results in a respectively small sensor signal $V_H$ with a low signal-to-noise ratio (SNR). In practice, the SNR may be below 0 dB. For the purpose of calibration, the analog sensor signal $V_H$ (Hall voltage) is provided at an external chip pin, which is labeled CAL in the example of FIG. 2. That is, the output of the Hall sensor 20 may be directly connected with the chip pin CAL, or the sensor signal $V_H$ may be pre-amplified (amplifier 22) while the amplifier output is connected to the chip pin CAL. The process of calibration and the calibration set-up is discussed later with respect to FIGS. 4 and 5. Generally, the analog sensor signal $V_H$ or any analog signal derived therefrom by analog signal processing may be provided to the external chip pin CAL. In this context "analog signal processing" may include any kind of signal processing, which does not involve a quantization of analog signals (to obtain a discrete-valued signal) carrying the information about the magnetic field H. In practice, a buffer amplifier may be used to decouple the (pre-amplified) analog sensor signal from the output terminal (e.g. to allow driving a large capacitive load of an output terminal CAL). However, the buffer amplifier may be regarded as included in the output stage of amplifier 22.

The example of FIG. 2 also includes a temperature sensor 26 and a chip stress sensor 27, which is configured to generate a sensor signal representing the mechanical stress in the semiconductor die, in which the magnetic field sensor 20 are integrated. The information about temperature and chip stress is provided to the DSP 30, which may therefore be configured to compensate for cross-sensitivities of the magnetic field sensor to temperature and chip stress. Furthermore, the information about the temperature and/or the chip stress may be provided to external devices, e.g. via the mentioned communication interface included in the DSP 30.

Figure 3:
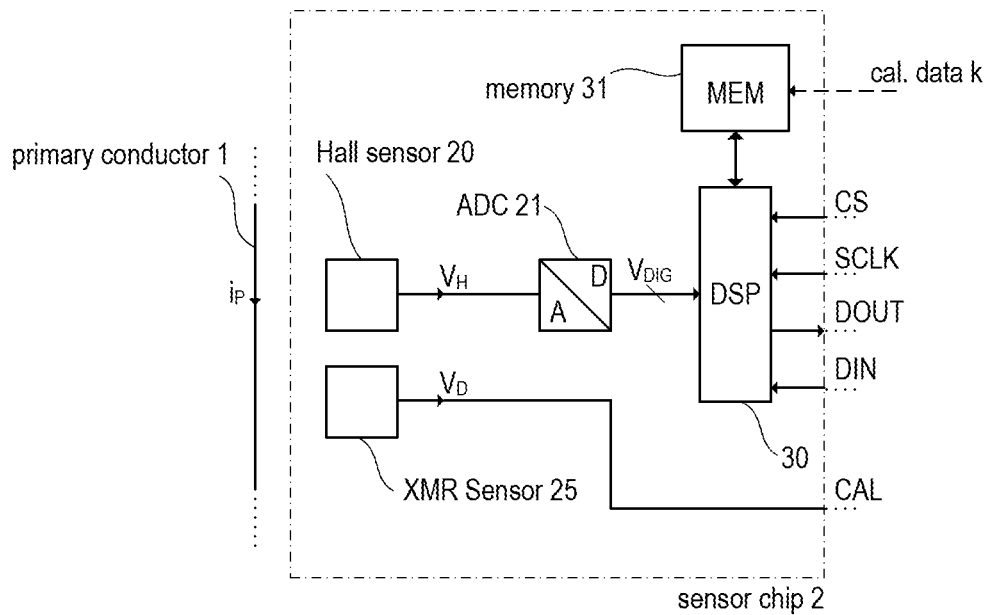
FIG. 3 is a block diagram illustrating one embodiment of a current sensor chip for use with an external primary conductor; the current sensor has an integrated Hall sensor and an integrated magneto-resistive sensor, wherein the sensor signal of the Hall sensor is digitized and provided to a digital output (after some signal processing) and the sensor signal of the magneto-resistive sensor is provided at an analog output for calibration of the current sensor.

FIG. 3 illustrates an alternative embodiment. The current sensor of FIG. 3 is similar to the current sensor of FIG. 2 but has a second magnetic field sensor (XMR sensor 25) in addition to the Hall sensor 20 (first magnetic field sensor). The first and the second magnetic field sensors are arranged closely to each other so that they practically "see" the same magnetic field H or closely related field components of the magnetic field H. However, even if—as the case may be—they do not see exactly the same magnetic field, the magnetic field at the position of the first magnetic field sensor may be extrapolated based on the magnetic field at the second magnetic field sensor, as the position of the two sensors relative to each other is well defined within the chip package. For example, the Hall sensor may be sensitive to a vertical component of the magnetic field H, whereas the XMR sensor may be sensitive to a horizontal component (assuming the semiconductor die being placed in a horizontal plane). In this case the horizontal and the vertical field components would correlate and one component could be derived from the other. In the present example, the output of the Hall sensor 20 is digitized and processed in the same way as in the previous example of FIG. 2. Also the digital communication interface (bus interface) is the same as in the previous example. However, the analog sensor signal provided at chip pin CAL is not provided by the Hall sensor 20 (as in the example of FIG. 2) but rather by the XMR sensor 25, which typically has a sensitivity that is significantly higher than the Hall sensor 20. Optionally, the sensor signal $V_D$ provided by the XMR sensor 25 may be amplified (and, as the case may be, buffered) before being supplied to the chip pin CAL. Finally it should be noted that so-called vertical Hall sensors could be used instead of lateral Hall sensors. Vertical Hall sensors, which are usually implemented in CMOS technology, are also sensitive to lateral (in-plane) field components (like XMR sensors).

Figure 4:
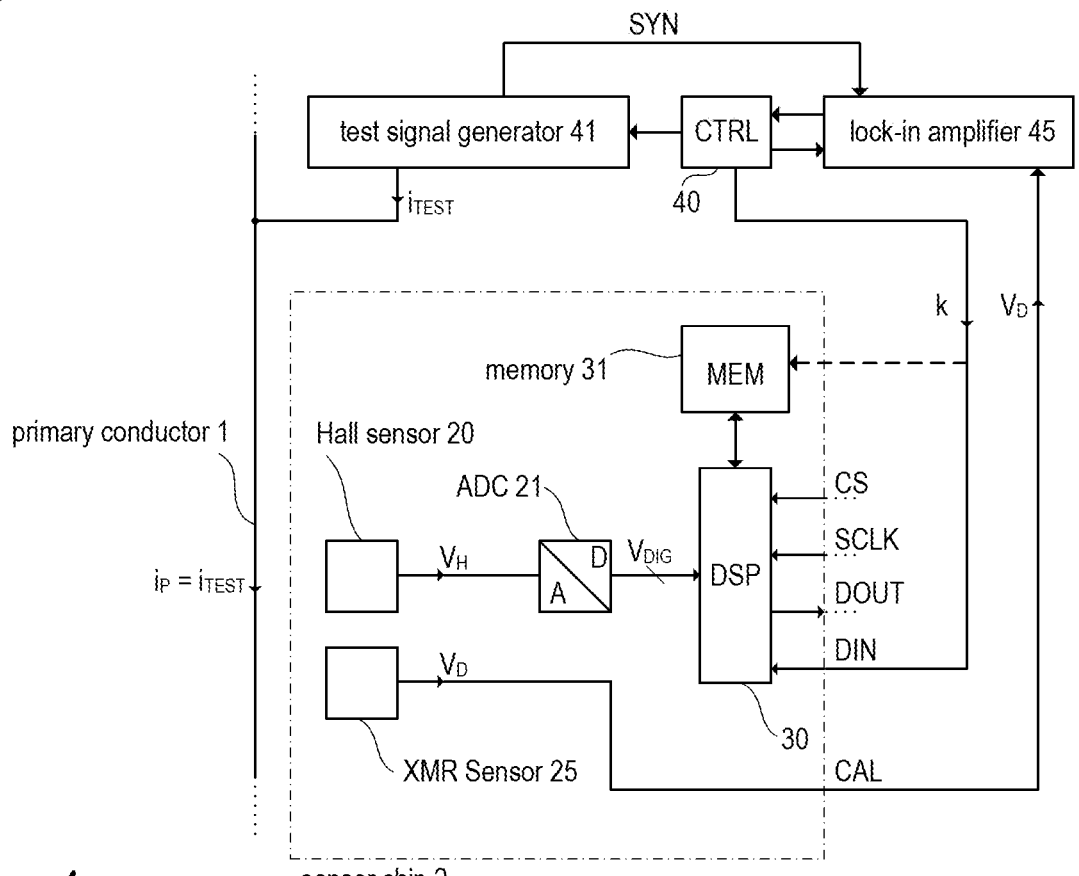
FIG. 4 is a block diagram illustrating one example of the set-up used for calibration of the sensor of FIG. 3.

FIG. 4 illustrates a set-up for calibrating the current sensor of FIG. 3. The term "set-up" may refer to a system, circuit and/or assembly of one or more systems, circuits, components, memory, processors and/or sensors, and may be configured to calibrate, measure, test and/or configure one or more components (e.g., a current sensor) disclosed herein. The sensor chip 2 shown in FIG. 4 is identical to the sensor chip of FIG. 3. The set-up of FIG. 4 additionally includes a controller 40 (e.g. a computer with suitable peripherals), a test signal generator 41 and a lock-in amplifier 45 operating in synchronization with the test signal generator 40. The test signal generator is configured to generate a modulated test signal (a simple sine signal in the present example) which is supplied to the primary conductor and thus results in a test current $i_{TEST}$ passing through the primary conductor 1. The test current $i_{TEST}$ is either known (i.e. set by appropriate design of the test signal generator 41) or separately measured (e.g. using a current measurement resistor in the current path of the test current $i_{TEST}$). The test current $i_{TEST}$ gives rise to corresponding magnetic field at the position of the Hall sensor 20 and the position of the XMR sensor 25. The XMR sensor 25 provides a corresponding analog sensor signal $V_D$, which is provided at the external pin CAL of the sensor chip 2. In the present case of a sinusoidal test current, the sensor signal $V_D$ has also a sinusoidal waveform with the same frequency as the test current.

The analog sensor signal $V_D$ is tapped at the external chip pin CAL and supplied to a demodulator, which is a lock-in amplifier in the present example. The lock-in amplifier 45 demodulates the sinusoidal sensor signal $V_D$ to measure its amplitude. The measured amplitude of the sensor signal $V_D$ is read by the calibration controller 40. For any given test current $i_{TEST}$ and based on the known sensor characteristic (characteristic $V_D/H$ curve) of the XMR sensor 25, the controller 40 is able to calculate the magnitude of the magnetic field H at the position of the magnetic field sensors 20, 25; and based on the magnetic field H the controller is also able to calculate the (calibrated) proportionality factor k ($k=H/i_P$) for the Hall sensor. The proportionality factor k thus obtained may be sent to the DSP 30 via the digital bus interface (serial data stream DIN) and stored—as calibration data—in memory 31 of the sensor chip 2. The stored calibration data can then be used for later measurements based on the sensor signal $V_H$ provided by the Hall sensor 20.

Figure 5:
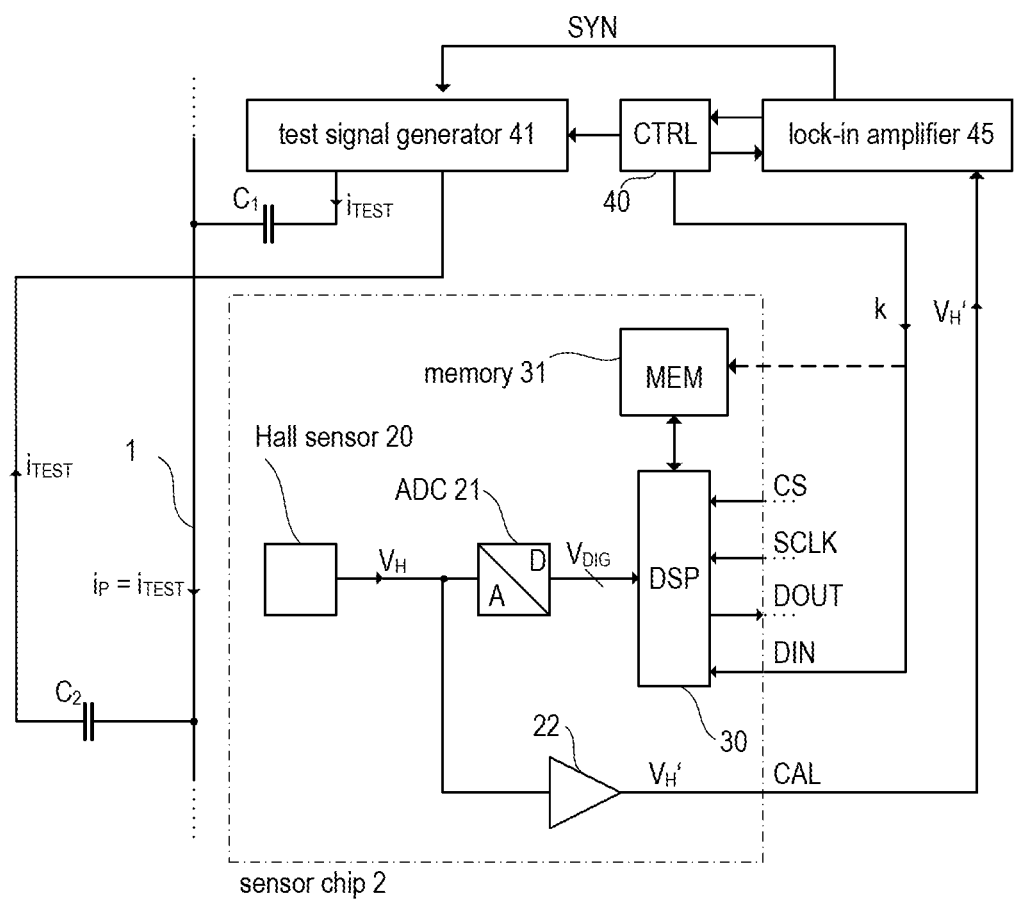
FIG. 5 is a block diagram illustrating one example of the set-up used for calibration of the sensor of FIG. 2.

FIG. 5 illustrates a set-up for calibrating the current sensor of FIG. 2. The set-up is essentially the same to the previous example of FIG. 5. In order to avoid repetitions, reference is made to the above description of FIG. 4. However, FIG. 5 illustrates how to inject the test current $i_{TEST}$ into the primary conductor 1 via a galvanic isolation. In the present example the galvanic isolation is implemented by the decoupling capacitors $C_1$ and $C_2$, which are connected between a first output terminal of the test signal generator 41 and one end of the external primary conductor 1 and, respectively, between a second output terminal of the test signal generator 41 and the other end of the external primary conductor 1. As an illustrative example we assume a capacitance of 470 nF for each of the capacitors $C_1$ and $C_2$ and a frequency $f_{TEST}$ of the test current $i_{TEST}$ of 10 kHz. The impedance Z of the series circuit of the capacitors $C_1$ and $C_2$ is thus $(2\pi f_{TEST} C_1)^{-1} + (2\pi f_{TEST} C_1)^{-1}$ and thus Z=67.73Ω (the resistance of the primary conductor is assumed to be negligible). Assuming further that the test signal generator 41 generates an alternating voltage $V_{TEST}$ signal with a frequency $f_{TEST}$ and an amplitude of 5V (applied to the series circuit of capacitor $C_1$, primary conductor 1, and capacitor $C_2$), this results in a test current $i_{TEST}$ of $V_{TEST}/Z$ with an amplitude of 73.83 mA. Assuming further that during operation of the current sensor a primary current $i_P$ of 100 A will cause a magnetic field H of 20 mT at the position of the Hall sensor 20, the test current $i_{TEST}$ will cause magnetic field of 14.77 µT, which is comparably low but can be readily measured with the help of the lock-in amplifier 45. For very small test currents $i_{TEST}$ the current sensor of FIGS. 3 and 4 would be easier to calibrate as the XMR sensor 25 used for calibration is usually more sensitive than the Hall sensor 20.

In the previous examples, a lock-in amplifier 45 has been used to demodulate a sinusoidal test current. However, other modulation/demodulation schemes may be used to generate a modulated test current for calibrating the current sensor integrated in the sensor chip 2 (see FIGS. 2 and 3). Alternatively, spread spectrum modulation techniques may be used, wherein the test current is modulated, e.g., with a pseudo-random spreading sequence (as it may be done when using a Direct Sequence Spread Spectrum (DSSSS) modulation). The resulting sensor signal $V_H$ (or $V_H'$) at the chip pin CAL will also be modulated with the spreading sequence, and the demodulator 45 may detect the amplitude of the sensor signal $V_H$ by demodulation even for extremely low signal-to-noise ratios. Using spread spectrum techniques for modulating the test current and demodulating the resulting (pre-amplified) analog sensor signal entails "distributing" the test current signal across a continuous frequency range of a defined bandwidth, which may correspond with the specified bandwidth of the current sensor chip for current measurements. When using test currents of a single frequency (i.e. modulated with a sinusoidal carrier), the resulting calibration data may be frequency-dependent due to the occurrence of eddy currents. Using a test current, which has a defined bandwidth corresponding to the (analog) bandwidth of current sensor chip, may thus be more "realistic" and yield better calibration data.

Of course the capacitive coupling using the decoupling capacitors $C_1$ and $C_2$ may also be used in the set-up of FIG. 4. Furthermore, it should be noted, that the connection between the controller 40 (e.g. a personal computer) and the demodulator 45 (e.g. lock-in amplifier) is not necessarily a physical signal connection. A human operator may enter the current reading of the sensor signal amplitude $V_{TH}$ as provided by the demodulator 45 into the controller 40. Similarly, the connection between the controller 40 and the test signal generator is also not necessarily a physical signal connection. However, the information about the test current $i_{TEST}$ (amplitude) should be available to the controller 40. It should be noted that in applications, in which a galvanic isolation is not needed, each of the capacitor $C_1$ and $C_2$ may be omitted or replaced by a resistor or a current source or any other suitable circuitry.

Figure 6:
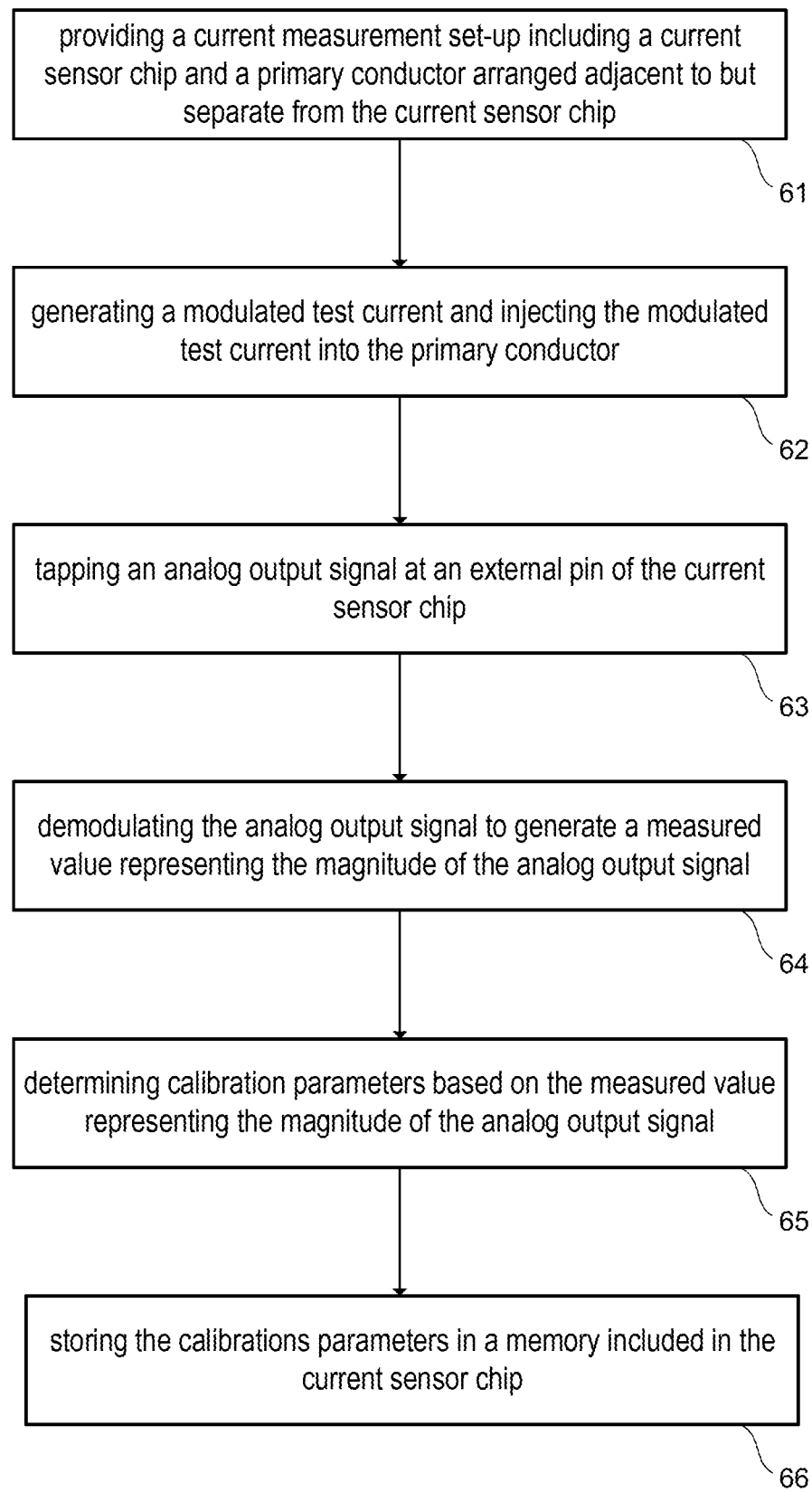
FIG. 6 is a flow chart illustrating one exemplary method of calibrating a current sensor chip.

FIG. 6 is a flow chart illustrating one exemplary method of calibrating a current sensor chip as shown in FIG. 2 or 3. In accordance with the depicted example, a current measurement set-up is provided, which includes a current sensor chip 2 (see, e.g., FIG. 2 or 3) and a primary conductor 1 arranged adjacent to but separate from the current sensor chip 2 (see FIG. 6, step 61). That is, the primary conductor 1 may be mechanically connected to the current sensor chip 2 but is external to (not integrated in) the (packaged) current sensor chip 2. A modulated test current $i_{TEST}$ is generated and injected—as primary current—into the primary conductor 1, thus causing a magnetic field H (see FIG. 6, step 62). The test current has a specific (preset) magnitude. An analog output signal (see, e.g., FIG. 4, signal $V_D$, or FIG. 5, signal $V_H'$) is tapped at an external pin CAL of the current sensor chip 2 (see FIG. 6, step 63). As explained with reference to the FIGS. 2 to 5, the analog output signal is either the analog sensor signal (signal $V_H$ or $V_D$) of a magnetic field sensor (Hall sensor 20 or XMR sensor 25) included in the current sensor chip 2 or derived therefrom (e.g. as signal $V_H'$ in the example of FIG. 5) by analog signal processing. The analog output signal is demodulated to generate a measured value representing the magnitude of the analog output signal (see FIG. 6, step 64). In the example of FIG. 5, the magnitude of the amplified Hall sensor signal $V_H'$ is measured using a lock-in amplifier as demodulator 45. Based on the measured value, which represents the magnitude of the analog output signal, calibration parameters are determined (see FIG. 6, step 65), for example by calculation using a mathematical model of the current measurement set-up. The calibrations parameters are then stored in memory 31 included in the current sensor chip 2 (see FIG. 6, step 66).

The mathematical model of the current measurement set-up may include the cross-sensitivities of the magnetic field sensor(s) to temperature and/or chip stress as already mentioned further above. Measured stress and temperature values can be made available to the controller 40 or other external devices e.g. via a serial bus communication interface as already explained above. Accordingly the calculation of the calibration parameters may be based on the measured value representing the magnitude of the analog output signal (e.g., $V_H'$), the known magnitude of the modulated test current $i_{TEST}$, as well as a measured temperature of the current sensor chip and/or a measured chip stress (i.e. a signal representing the mechanical stress in the semiconductor die, in which the magnetic field sensor is integrated).

While various embodiments of the invention have been described, it will be apparent to those of ordinary skill in the art that many more embodiments and implementations are possible within the scope of the invention. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Additional embodiments are provided below.

1. A current sensor chip that comprises:
a first magnetic field sensor element being configured to generate a first analog sensor signal that represents a magnetic field caused by a primary current passing through an external primary conductor;
an analog-to-digital converter coupled to the first magnetic field sensor element and configured to generate a digital sensor signal based on the first analog sensor signal;
a digital signal processor coupled to the analog-to-digital converter to receive the digital sensor signal and configured to determine, based on the digital sensor signal and calibration parameters stored in a memory, a corresponding current measurement signal, which represents the primary current; and
an external output pin coupled to the first magnetic field sensor element to receive the first analog sensor signal or an analog signal derived therefrom by analog signal processing.

2. The current sensor chip according to embodiment 1, wherein the analog signal processing does not involve a quantization of analog signals, which carry information about the magnetic field caused by a primary current.

3. The current sensor chip according to embodiment 1 or 2,
wherein the first magnetic field sensor element is a Hall sensor or a magneto-resistive sensor.

4. The current sensor chip according to any of embodiments 1 to 3 further comprising at least one of:
a temperature sensor configured to generate a temperature signal, the temperature signal being provided to the digital signal processor and/or made available to an external device;
a chip stress sensor configured to generate a stress signal, the stress signal being provided to the digital signal processor and/or made available to an external device.

5. The current sensor chip according to any of embodiments 1 to 4 further comprising:
a communication interface circuit connected to the digital signal processor, wherein the digital signal processor is configured to digitally communicate with external devices via the communication interface circuit.

6. The current sensor chip according to any of embodiments 1 to 5, wherein the digital signal processor is configured to receive data via the communication interface and store the received data, as calibration parameters, in the memory.

7. A current sensor chip that comprises:
a first magnetic field sensor element being configured to generate a first analog sensor signal responsive to a magnetic field caused by a primary current passing through an external primary conductor;

a second magnetic field sensor element being configured to generate a second analog sensor signal responsive to magnetic field caused by the primary current passing through the external primary conductor;

an analog-to digital converter coupled to the second magnetic field sensor element and configured to generate a digital sensor signal based on the second analog sensor signal;

a digital signal processor coupled to the analog-to-digital converter to receive the digital sensor signal and configured to determine, based on the digital sensor signal and calibration parameters stored in a memory, a corresponding current measurement signal, which represents the primary current; and an external output pin coupled to the first magnetic field sensor element to receive the first analog sensor signal or an analog signal derived therefrom by analog signal processing.

8. The current sensor chip according to embodiment 7, wherein the analog signal processing does not involve a quantization of analog signals, which carry information about the magnetic field caused by a primary current.

9. The current sensor chip according to embodiment 7 or 8,
wherein the first magnetic field sensor element is a Hall sensor or a magneto-resistive sensor.

10. The current sensor chip according to any of embodiments 7 to 9 further comprising at least one of:
a temperature sensor configured to provide a temperature signal to the digital signal processor;
a chip stress sensor configured to provide a stress signal to the digital signal processor.

11. The current sensor chip according to any of embodiments 7 to 10 further comprising:
a communication interface circuit connected to the digital signal processor, wherein the digital signal processor is configured to digitally communicate with external devices via the communication interface circuit.

12. The current sensor chip according to any of embodiments 7 to 11, wherein the digital signal processor is configured to receive data via the communication interface and store the received data, as calibration parameters, in the memory.

13. A system for calibrating a current sensor chip; the system comprises:
a current measurement set-up including a current sensor chip and a primary conductor arranged adjacent to but separate from the current sensor chip, the current sensor chip including:
  a first magnetic field sensor element configured to generate a first analog sensor signal responsive to a magnetic field caused by a primary current passing through the primary conductor;
  a digital-analog-converter coupled to the first magnetic field sensor element or a second magnetic field sensor element and configured to generate a digital sensor signal based on the first analog sensor signal or, respectively, based on a second analog sensor signal, which is generated by the second magnetic field sensor element;
  a memory for storing calibration parameters;
  an digital signal processor configured to determine, using the calibration parameters stored in the memory and the digital sensor signal, a current measurement signal, which represents the primary current; and
  an output pin coupled to the first magnetic field sensor to receive the first analog sensor signal or an analog signal derived therefrom by analog signal processing and provide it as analog output signal;

a test signal generator configured to provide a modulated test current; the test signal generator being coupled to the primary conductor to inject the test current, as primary current, into the primary conductor;

a demodulator coupled to the output pin of the current sensor chip to receive the analog output signal, the demodulator being configured to demodulate the analog output signal and to provide a measured value representing the magnitude of the analog output signal;

a controller coupled to the current sensor chip to transmit, to the memory of the current sensor chip, calibration parameters, which are based on the measured value representing the magnitude of the analog output signal.

14. The system according to embodiment 13,
wherein the demodulator and the test signal generator are synchronized and the demodulator is configured to demodulate the analog output signal synchronously to the modulated test current.

15. The system according to embodiment 13 or 14,
wherein the controller receives the calibration parameter by input of a human operator.

16. The system according to embodiment 13 or 14,
wherein the controller is configured to calculate the calibration parameter based on input data received from a human operator.

17. The system according to embodiment 13 or 14,
wherein the controller is connected to the demodulator to receive data, which represents the measured value representing the magnitude of the first analog output signal, and
wherein the controller being configured to calculate the calibration parameters based on data received from the demodulator.

18. The system according to any of embodiments 13 to 17,
wherein the modulated test current has a sinusoidal waveform and a specific magnitude and a specific test frequency, and
wherein the demodulator is a lock-in amplifier configured to demodulate the analog output signal by mixing it with a sinusoidal demodulation signal having the test frequency.

19. The system according to any of embodiments 13 to 17,
wherein the modulated test current is modulated with a spreading sequence in accordance with a DSSS modulation technique, and
wherein the demodulator is a DSSS demodulator configured to demodulate signals modulated in accordance with the DSSS modulation technique.

20. A method for calibrating a current sensor chip; the method comprises:
providing a current measurement set-up including a current sensor chip and a primary conductor arranged adjacent to but separate from the current sensor chip;
generating a modulated test current having a specific magnitude and injecting the modulated test current—as primary current—into the primary conductor, thus causing a magnetic field;
tapping an analog output signal at an external pin of the current sensor chip; the analog output signal being an analog sensor signal or derived therefrom by analog signal processing, wherein the analog sensor signal is generated by a magnetic field sensor included in the current sensor chip;
demodulating the analog output signal to generate a measured value representing the magnitude of the analog output signal;
determining, based on the measured value, calibration parameters;
storing the calibrations parameters in a memory included in the current sensor chip.

21. The method of embodiment 20, wherein determining calibration parameters comprises:
calculating calibration parameters based on the measured value representing the magnitude of the analog output signal and the magnitude of the modulated test current.

22. The method of embodiment 20, wherein determining calibration parameters comprises:
calculating calibration parameters based on the measured value representing the magnitude of the analog output signal, the magnitude of the modulated test current, and a measured temperature of the current sensor chip.

23. The method of embodiment 20, wherein determining calibration parameters comprises:
calculating calibration parameters based on the measured value representing the magnitude of the analog output signal, the magnitude of the modulated test current, and a measured stress of the current sensor chip.

What is claimed is:

1. A current sensor chip comprising:
a first magnetic field sensor element configured to generate a first analog sensor signal that represents a magnetic field caused by a primary current passing through an external primary conductor;
an analog-to-digital converter coupled to the first magnetic field sensor element and configured to generate a digital sensor signal based on the first analog sensor signal;
a digital signal processor coupled to the analog-to-digital converter to receive the digital sensor signal, and configured to determine, based on the digital sensor signal, at least one calibration parameter, a first cross-sensitivity parameter, and a second cross-sensitivity parameter, a corresponding current measurement signal, which represents the primary current, wherein the digital signal processor is configured to compensate the at least one calibration parameter based on the first cross-sensitivity parameter and the second cross-sensitivity parameter;
a temperature sensor configured to generate a temperature signal, the temperature signal being provided to the digital signal processor as the first cross-sensitivity parameter; and
a chip stress sensor configured to generate a stress signal, the stress signal being provided to the digital signal processor as the second cross-sensitivity parameter; and
an external output pin coupled to the first magnetic field sensor element to receive the first analog sensor signal or an analog signal derived therefrom by analog signal processing.

2. The current sensor chip according to claim 1, wherein the analog signal processing does not involve a quantization of analog signals which carry information about the magnetic field caused by a primary current.

3. The current sensor chip according to claim 1, wherein the first magnetic field sensor element is a Hall sensor or a magneto-resistive sensor.

4. The current sensor chip according to claim 1, further comprising:
a communication interface circuit connected to the digital signal processor, wherein the digital signal processor is configured to digitally communicate with external devices via the communication interface circuit.

5. The current sensor chip according to claim 4, wherein the digital signal processor is configured to receive data via the communication interface circuit and store the received data, as calibration parameters, in the memory.

6. The current sensor chip according to claim 1, wherein the digital signal processor is configured determine the at least one calibration parameter based on the first analog sensor signal, the at least one cross-sensitivity parameter, and a magnitude of a test current injected into the external primary conductor.

7. The current sensor chip according to claim 1, wherein each of the at least one calibration parameter is a calibrated proportionality factor between the magnetic field and the primary current.

8. A system for calibrating a current sensor chip, the system comprising:
a current measurement set-up including a current sensor chip and a primary conductor arranged adjacent to, but separate from, the current sensor chip; the current sensor chip including:
a first magnetic field sensor element configured to generate a first analog sensor signal responsive to a magnetic field caused by a primary current passing through the primary conductor;
a digital-analog-converter coupled to the first magnetic field sensor element and configured to generate a digital sensor signal based on the first analog sensor signal;
a memory for storing at least one calibration parameter;
an digital signal processor configured to determine, using the at least one calibration parameter stored in the memory and the digital sensor signal, a current measurement signal, which represents the primary current; and
an output pin coupled to the first magnetic field sensor to receive the first analog sensor signal or an analog signal derived therefrom by analog signal processing and provide it as an analog output signal;
a test signal generator configured to provide a modulated test current, the test signal generator coupled to the primary conductor to inject the modulated test current, as the primary current, into the primary conductor;
a demodulator coupled to the output pin of the current sensor chip to receive the analog output signal, the demodulator configured to demodulate the analog output signal and to provide a measured value representing a magnitude of the analog output signal; and
a controller configured to determine the at least one calibration parameter based on the measured value representing the magnitude of the analog output signal and at least one cross-sensitivity parameter, wherein the controller is coupled to the current sensor chip to transmit, to the memory of the current sensor chip, the at least one calibration parameter.

9. The system according to claim 8, wherein the demodulator and the test signal generator are synchronized and the demodulator is configured to demodulate the analog output signal synchronously to the modulated test current.

10. The system according to claim 8, wherein the digital signal processor is configured to calculate the at least one calibration parameter based on input data received from a human operator.

11. The system according to claim 8, wherein the controller is connected to the demodulator to receive data, which represents the measured value representing the magnitude of the first analog output signal, and
wherein the controller is configured to calculate the at least one calibration parameter based on data received from the demodulator.

12. The system according to claim 8, wherein the modulated test current has a sinusoidal waveform and a specific magnitude and a specific test frequency, and
wherein the demodulator is a lock-in amplifier configured to demodulate the analog output signal by mixing the analog output signal with a sinusoidal demodulation signal having the test frequency.

13. The system according to claim 8, wherein the modulated test current is modulated with a spreading sequence in accordance with a Direct Sequence Spread Spectrum (DSSS) modulation technique, and
wherein the demodulator is a DSSS demodulator configured to demodulate signals modulated in accordance with the DSSS modulation technique.

14. The system according to claim 8, wherein the controller is configured determine the at least one calibration parameter based on the measured value representing the magnitude of the analog output signal, the at least one cross-sensitivity parameter, and a magnitude of a test current injected into the primary conductor.

15. The system according to claim 8, wherein each of the at least one calibration parameter is a calibrated proportionality factor between the magnetic field and the primary current.

16. A method for calibrating a current sensor chip, the method comprising:
providing a current measurement set-up including a current sensor chip and a primary conductor arranged adjacent to, but separate from, the current sensor chip;
generating a modulated test current having a specific magnitude and injecting the modulated test current, as a primary current, into the primary conductor and causing a magnetic field;
tapping an analog output signal at an external pin of the current sensor chip, the analog output signal being an analog sensor signal or derived therefrom by analog signal processing, wherein the analog sensor signal is generated by a magnetic field sensor included in the current sensor chip;
generating a digital sensor signal based on the analog sensor signal;
demodulating the analog output signal to generate a measured value representing a magnitude of the analog output signal;
determining at least one calibration parameter based on the measured value and at least one cross-sensitivity parameter;
storing the at least one calibration parameter in a memory included in the current sensor chip: and
determining, using the at least one calibration parameter stored in the memory and the digital sensor signal, a current measurement signal, which represents the primary current.

17. The method of claim 16, wherein determining the at least one calibration parameter comprises:
calculating the at least one calibration parameter based on the measured value representing the magnitude of the analog output signal, the at least one cross-sensitivity parameter, and the specific magnitude of the modulated test current.

18. The method of claim 16, wherein determining at least one calibration parameter comprises:
calculating the at least one calibration parameter based on the measured value representing the magnitude of the analog output signal, the specific magnitude of the modulated test current, and the at least one cross-sensitivity parameter, wherein the at least one cross-sensitivity parameter includes a measured temperature of the current sensor chip.

19. The method of claim 16, wherein determining the at least one calibration parameter comprises:
calculating the at least one calibration parameter based on the measured value representing the magnitude of the analog output signal, the specific magnitude of the modulated test current, and the at least one cross-sensitivity parameter, wherein the at least one cross-sensitivity parameter includes a measured stress of the current sensor chip.

* * * * *